US011513000B2

(12) United States Patent
Tamatsukuri

(10) Patent No.: US 11,513,000 B2
(45) Date of Patent: Nov. 29, 2022

(54) WAVEFORM ANALYSIS DEVICE AND WAVEFORM ANALYSIS METHOD

(71) Applicant: RORZE Corporation, Hiroshima (JP)

(72) Inventor: Daigo Tamatsukuri, Hiroshima (JP)

(73) Assignee: RORZE CORPORATION

( * ) Notice: Subject to any disclaimer, the term of this patent is extended or adjusted under 35 U.S.C. 154(b) by 835 days.

(21) Appl. No.: 16/466,792

(22) PCT Filed: Dec. 4, 2017

(86) PCT No.: PCT/JP2017/043410
§ 371 (c)(1),
(2) Date: Jun. 5, 2019

(87) PCT Pub. No.: WO2018/110337
PCT Pub. Date: Jun. 21, 2018

(65) Prior Publication Data
US 2019/0339119 A1    Nov. 7, 2019

(30) Foreign Application Priority Data
Dec. 12, 2016   (JP) .............................. JP2016-240729

(51) Int. Cl.
*G01H 11/06*        (2006.01)
*H01L 21/677*       (2006.01)
(Continued)

(52) U.S. Cl.
CPC .............. *G01H 11/06* (2013.01); *G01H 1/06* (2013.01); *G01N 29/14* (2013.01);
(Continued)

(58) Field of Classification Search
CPC .......... G01H 11/06; G01H 1/06; G01H 1/003; H01L 21/677; H01L 21/67288;
(Continued)

(56) References Cited

U.S. PATENT DOCUMENTS 5,710,715 A * 1/1998 Shitanda ................ G01H 1/003
702/56
6,199,018 B1 * 3/2001 Quist ................... G01M 13/028
706/912
(Continued)

FOREIGN PATENT DOCUMENTS

JP        2-57924      2/1990
JP        02-262993    10/1990
(Continued)

OTHER PUBLICATIONS

International Search Report for PCT/JP2017/043410, dated Feb. 13, 2018 (2 pages).

*Primary Examiner* — Helen C Kwok
(74) *Attorney, Agent, or Firm* — Merek, Blackmon & Voorhees, LLC

(57) ABSTRACT

Provided are a waveform analysis method and a waveform analysis device capable of preventing, in advance, a breakage accident during operation and preventing stoppage due to breakdown of machinery and performing efficient maintenance work by specifying a degraded part from among the parts that constitute the machinery. A waveform analysis device 30 is provided with; a signal analysis unit 31 for performing fast Fourier transform for a signal transmitted from a sensor 28 that detects a physical phenomenon in the machinery an impulse extraction unit 32 for extracting an impulse component from spectrum data generated by the signal analysis unit 31; a display unit 35 for displaying waveform data including the impulse component extracted by the impulse extraction unit 32; and a data editing unit 33 for editing, from data of a waveform including the impulse component displayed by the display unit 35, waveform data in a range selected via an input unit 36 by a worker, generating a graph displaying a frequency, a time, and the intensity of the impulse component, and displaying the graph on the display unit 35.

11 Claims, 12 Drawing Sheets

(51) Int. Cl.
*G01H 1/06* (2006.01)
*G01N 29/44* (2006.01)
*G01N 29/14* (2006.01)
*G01N 29/46* (2006.01)

(52) U.S. Cl.
CPC ....... *G01N 29/4427* (2013.01); *H01L 21/677* (2013.01); *G01N 29/46* (2013.01)

(58) Field of Classification Search
CPC .. H01L 21/67766; G01N 29/46; G01N 29/14; G01N 29/4427; G01M 5/0066; G06F 11/008; G05B 23/0283; G05B 23/0221; G05B 19/41875
See application file for complete search history.

(56) References Cited

U.S. PATENT DOCUMENTS

| | | | | |
|---|---|---|---|---|
| 6,434,512 | B1* | 8/2002 | Discenzo | F16C 41/008 702/184 |
| 9,443,201 | B2* | 9/2016 | Claussen | G06K 9/6284 |
| 10,168,248 | B1* | 1/2019 | Morey | G01M 13/045 |
| 2004/0030419 | A1* | 2/2004 | Miyasaka | G01H 3/08 700/32 |
| 2005/0177321 | A1* | 8/2005 | Wang | B41F 13/012 702/35 |
| 2008/0215292 | A1* | 9/2008 | Kato | G01M 13/028 702/183 |
| 2012/0239317 | A1* | 9/2012 | Lin | H01L 21/67288 702/56 |
| 2013/0090868 | A1* | 4/2013 | Kajiwara | G01M 5/0066 702/56 |
| 2015/0346717 | A1* | 12/2015 | Hosek | G06F 11/2257 702/183 |

FOREIGN PATENT DOCUMENTS

| | | |
|---|---|---|
| JP | 2006-322947 | 3/2006 |
| JP | 2010-166686 | 7/2010 |
| JP | 2012-251851 | 12/2012 |
| JP | WO2015/011791 | 1/2015 |
| JP | 2015-78884 | 4/2015 |

\* cited by examiner

WAVEFORM ANALYSIS DEVICE AND WAVEFORM ANALYSIS METHOD

FIELD OF THE INVENTION

The present invention relates to an analysis device and an analysis method for diagnosing a machinery state by detecting a physical phenomenon such as a sound or vibrations generated during an operation of a machinery such as an articulated robot or the like as a signal waveform. Particularly, the present invention relates to a waveform analysis device for analyzing the signal waveform of a sound or vibrations generated by operations of a driving mechanism such as a bearing or a feed screw mechanism provided on moving parts of the articulated robot, a rotating machine and a linear guide such as a reduction gear or the like, and a waveform analysis method using the waveform analysis device to analyze the signal waveform.

BACKGROUND OF THE INVENTION

A method and a device for preventing stoppage due to breakdown and a breakage accident during operation beforehand have been devised by finding deterioration of the part of a machinery.

Patent literature 1 discloses a determining means for transmitting a deterioration signal in case a detection value detected by a sensor provided on a robot is compared with and above a previously stored reference value, wherein the sensor detects a physical phenomenon such as a sound or vibrations generated by the robot, the deformation of a component or the like. In addition, a robot component deterioration detecting device with processing means for executing a required processing operation such as an alarm signal transmission, a robot operation stop or the like in response to the deterioration signal transmitted by the determining means is also disclosed.

The above technique made it possible to prevent stoppage due to breakdown of the robot and a breakage accident during operation beforehand. However, in order to detect the abnormality of the robot, in advance, a plurality of deterioration sounds need to be registered by measuring sounds when deterioration occurs at a particular place and on a particular cause. According to this method, it takes time to register the plurality of deterioration sounds after a new product is released, and therefore, it is difficult to detect the abnormality of the robot that has just been released.

PRIOR ART

Patent Literature

Patent literature 1: Japanese Patent Laid Open Publication No. 2-262993

DISCLOSURE OF THE INVENTION

Problem to be Solved by the Invention

The present invention is devised to solve the above-mentioned problems, and aims to provide a detection method and a detection device capable of preventing a breakage accident during operation and stoppage due to breakdown of a machinery, and capable of performing efficient maintenance work by specifying a degraded part from among the parts that constitute the machinery.

Means to Solve the Problem

To solve the above mentioned problems, a waveform analysis device of the present invention is to analyze a waveform of a detected signal by detecting a physical phenomenon which is generated during operation of the machinery, wherein the waveform analysis device includes a signal analysis unit for performing fast Fourier transform for a signal transmitted from a sensor that detects the physical phenomenon, an impulse extraction unit for extracting an impulse component from spectrum data generated by the signal analysis unit, a display unit for displaying waveform data including the impulse component extracted by the impulse extraction unit, and a data editing unit for editing, from data of a waveform including the impulse component displayed by the display unit, waveform data in a range select via an input unit by a worker, generating a graph displaying a frequency, a time, and the intensity of the impulse component, and displaying the graph on the display unit.

The physical phenomenon generated during operation of the machinery refers to a phenomenon such as a sound, vibrations, or the deflection of each component. In the machinery in which a trouble occurs, an impulse waveform is included in the waveforms that detect the physical phenomenon during operation. Accordingly, the occurrence of the trouble can be detected by analyzing the detected waveform data and then by generating a graph showing three elements such as a frequency, a time, and the intensity of each impulse component.

In addition, the waveform analysis device of the present invention is characterized by further providing a determination unit for determining the presence of abnormalities in the machinery based on the above-mentioned spectrogram which is presented by the data editing unit. According to this, the waveform analysis device can issue a caution that the machinery has an abnormality when the impulse component having the intensity exceeding a predetermined threshold is generated, thereby eliminating variations in the abnormality determination by the worker. Further, it is possible to reduce the time that the worker expends for determination.

Besides, a sensor for detecting the physical phenomenon of the machinery, which is connected to the waveform analysis device of the present invention, is characterized in that it is a vibration sensor for detecting vibrations. Further, this sensor of the present invention is characterized in that it is a microphone for detecting vibrations. Furthermore, the machinery is characterized in that it is a transfer robot for holding and transferring a semiconductor. In addition, the waveform analysis device of the present invention can be connected to a semiconductor manufacturing system.

Effects of Invention

According to the present invention, the transfer robot can be repaired before stoppage by failure, and therefore, it is possible to prevent a trouble that the whole production line is stopped. In addition, even if a trouble that a wafer held by the transfer robot comes into contact with a storage container occurs, the occurrence of the trouble during operation can be detected by calculating the intensity of the impulse component at the time of the contact.

PREFERRED EMBODIMENT OF THE INVENTION

The inventor focused that an impulse waveform is included in waveforms for detecting a physical phenomenon such as a sound or vibrations during operation when a driving mechanism such as a bearing or a feed screw mechanism deteriorates or collides with something, and devised a device and a method for extracting the impulse waveform from the waveforms generated during operation of the driving mechanism. It is known that an ideal impulse waveform generates only for an extremely short time and includes a fixed amplitude in a wide frequency band. The inventor has found that there exists an impulse waveform generating only for a comparative short time and including the fixed amplitude in the wide frequency band in physical phenomenon waveforms generated during operation of a machinery that has a trouble. In addition, the inventor has found that a waveform including an impulse waveform of a transfer robot having a trouble has a larger amplitude at any frequency band in comparison with a waveform during operation of a normal transfer robot when the transfer robot having a trouble operates.

Then, the inventor devised a method and a device for evaluating the deterioration degree of each part of the transfer robot by detecting occurrence frequency of the impulse component by making waveforms within a given operating time in a spectrogram when detecting and recognizing an occurrence of the impulse component by analyzing the physical phenomenon waveform detected during operation of the transfer robot which is one of machinery.

Figure 1:
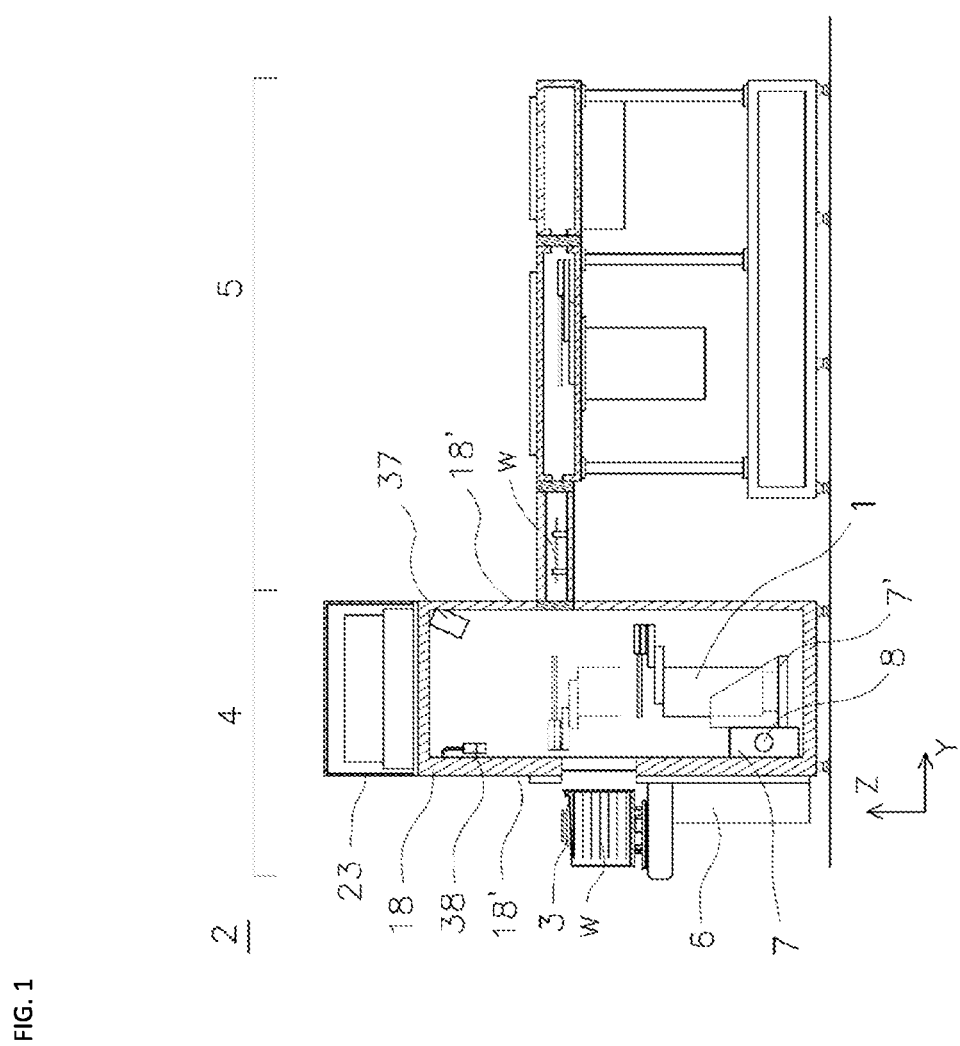
FIG. 1 is a sectional view showing outline of a semiconductor manufacturing system 2.
Figure 2:
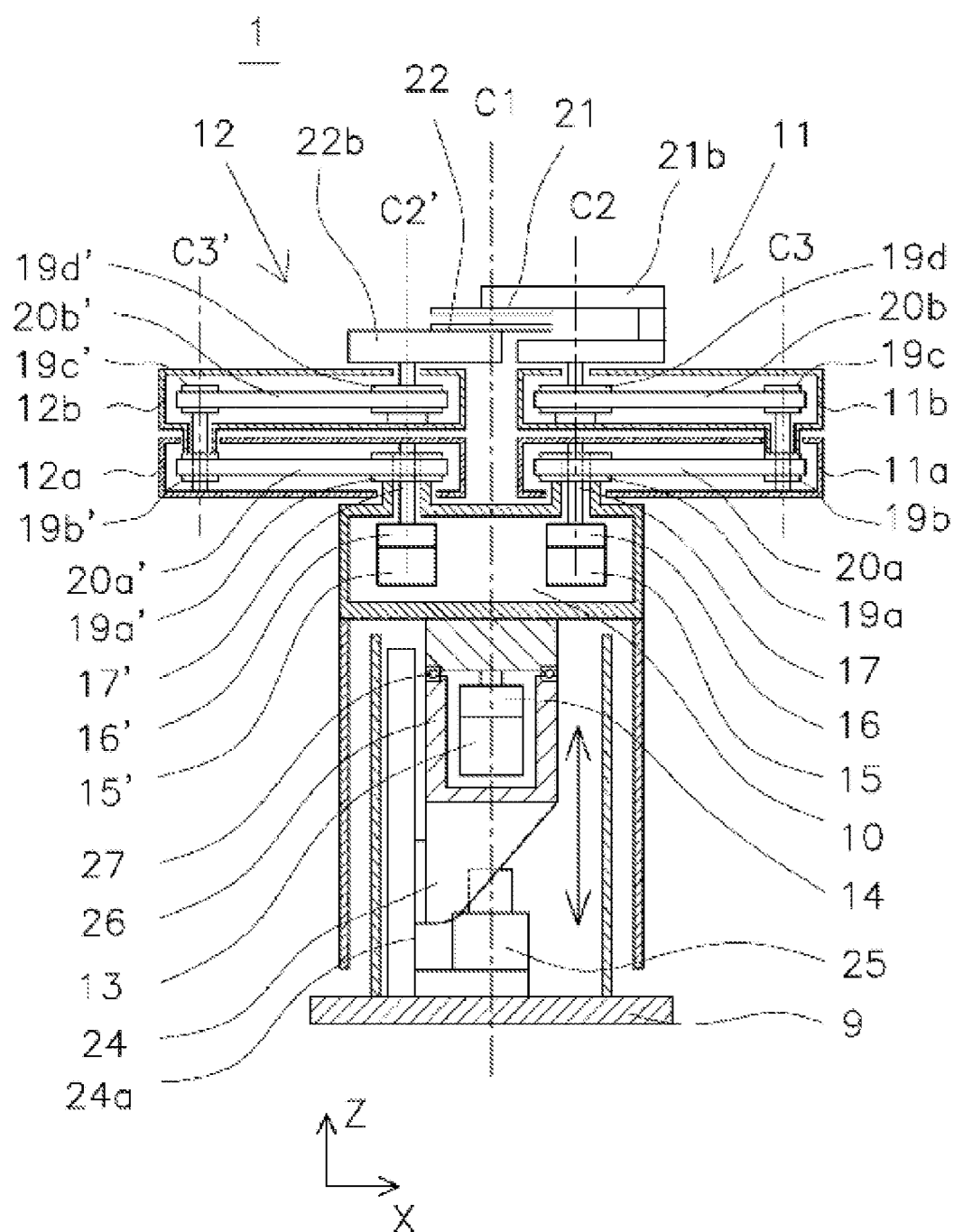
FIG. 2 is a sectional view showing outline of a transfer robot 1.
Figure 3:
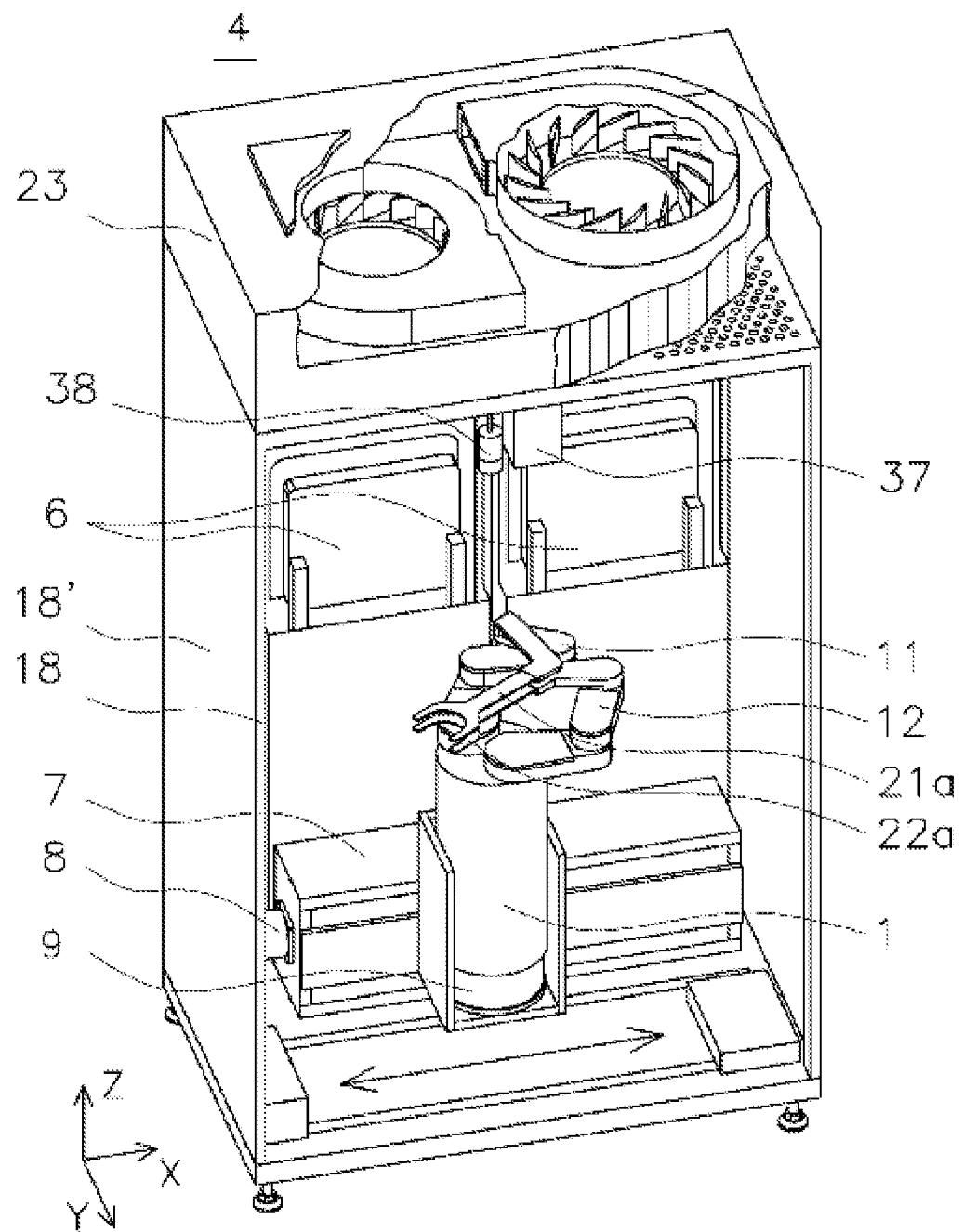
FIG. 3 is a perspective view showing an EFEM 4 of a device constituting the semiconductor manufacturing system 2.

Embodiments of the present invention will be explained in detail with reference to the drawings below. First, as an example of the present invention, a transfer robot 1 for transferring a semiconductor wafer W of a disk-like substrate to a predetermined place and a semiconductor manufacturing system 2 having the transfer robot 1 will be explained. FIG. 1 is a sectional view showing an outline of the semiconductor manufacturing system 2, FIG. 2 is a sectional view showing an outline of the transfer robot 1, and FIG. 3 is a perspective view showing an EFEM 4 of a device constituting the semiconductor manufacturing system 2. The semiconductor manufacturing system 2 includes an EFEM (Equipment Front End Module) 4 for transferring a semiconductor wafer W from the preceding process to a load lock chamber of a replay chamber between an air atmosphere and a vacuum atmosphere, and a processing device 5 for applying various kinds of processing on the surface of the semiconductor wafer W transferred into the load lock chamber in a predetermined atmosphere. Here, the semiconductor wafer W is compatible with being stored in an airtight container which is called a FOUP (Front-Opening Unified Pod) 3.

The EFEM 4 includes a load port 6 on which the FOUP 3 is placed, and the transfer robot 1. The lid of the FOUP 3 is opened and closed by the load port 6. The transfer robot 1 holds and transfers the semiconductor wafer W stored in the FOUP 3 to the processing device 5 along a predetermined route.

In an inner space of the EFEM 4 in which the transfer robot 1 is disposed, the inner space is surrounded by partition members composed of a flame 18 and a cover 18' on every side, and a FFU (Fun Filter Unit) 23 is loaded on a ceiling part. The FFU 23 filters an air introduced by rotations of a fan through a filter as a clean air, and supplies it into the EFEM 4. Here, dust generated by the operation of the transfer robot 1 is discharged outside the EFEM 4 by a down flow of the clean air supplied from the FFU 23. Therefore, the inside of the EFEM 4 is always kept in a clean atmosphere.

The transfer robot 1 of this embodiment is a SCARA (Selective Compliance Assembly Robot Arm) type robot of a so-called double arm, and a base 9 of the transfer robot 1 is fixed on a moving element of a horizontal travel mechanism 7 for moving the transfer robot 1 in a linear direction within a horizontal plane through a blanket 7. The horizontal travel mechanism 7 is composed of a not-illustrated pair of guide rails for guiding the transfer robot 1 in a predetermined direction within the horizontal plane, a not-illustrated feed screw mechanism disposed parallel to the guide rails, and a travelling drive motor 8 for rotatably driving a screw shaft of the feed screw mechanism. Besides, the travelling drive motor 8 and the feed screw mechanism are respectively provided with bearings for smoothly rotating driving shaft members, and the guide rails are provided with ball retainers for reducing sliding resistance of a slide block slidably moving on the rails. A friction reducing member such as a bearing or a ball retainer causes vibrations during operation because the operation for a long time promotes an abrasion and a deterioration of grease applied on the inside.

Further, the transfer robot 1 is provided with the base 9, a liftably-rotatably movable body 10 with respect to the base 9, and a pair of liftably-rotatably movable arm bodies 11, 12 with respect to the base 9 and the body 10. The body 10 is supported through brackets 26 to the moving element of guide rails 24a provided on a lift mechanism 24 mounted on the base 9, and moves up and down with respect to the base 9. The lift mechanism 24 is composed of the guide rails 24a for guiding the transfer robot 1 in a vertical direction, the not-illustrated feed screw mechanism disposed parallel to the guide rails 24a, and a lifting drive motor 25 for rotating the screw shaft of the feed screw mechanism. Further, the body 10 is rotatably mounted on the brackets 26 through a bearing 27. A reduction gear 14 and a rotatably driving motor 13 for rotatably moving the body 10 with respect to the base 9 are provided to the lower part of the body 10 and fixed on the brackets 26, and the body 10 is rotated around a central axis C1 extending in a vertical direction within the horizontal plane by the operation of the rotating drive motor 13. Here, the lifting drive motor 25, the feed screw mechanism and the rotating drive motor 13 in the lift mechanism 24 are provided with the not-illustrated bearing for smoothly rotating the driving shaft members. Further, the guide rails 24a are provided with the ball retainer for reducing the sliding resistance of the slide blocks moving slidably on the rails. The friction reducing member such as the bearing 27 or the ball retainer causes vibrations during operation because the operation for a long time promotes the abrasion and the deterioration of the grease applied on the inside.

A pair of arm bodies 11, 12 are symmetrically provided to the upper part of the body 10, and the arm body 11 disposed to the right side in view of the figure is composed of a lower arm 11a, an upper arm 11b and an upper finger 21. One end of the lower arm 11a is rotatably mounted on the body 10 through the bearing, so that the lower arm 11a can rotate within the horizontal plane with respect to the body 10 around a central axis C2 extending in the vertical direction. The lower arm 11a is rotated by an arm driving motor 15 which is disposed in the body 10. More particularly, the arm driving motor 15 is connected to a reduction gear 16, an output shaft 17 projecting from the reduction gear 16 is fixed to the one end of the lower arm 11a, so that rotations of the output shaft of the arm driving motor 15 are transmitted to the lower arm 11a as being decelerated to the predetermined number of rotations by the reduction gear 16.

Further, a pulley 19b is disposed to the other end of the lower arm 11a, and the pulley 19b and one end of the upper arm 11b are integrally fixed. The pulley 19b is rotatably mounted on the lower arm 11a through the bearing, so that the pulley 19b and the upper arm 11b can integrally rotate within the horizontal plane with respect to the lower arm 11a around a central axis C3 extending in the vertical direction. Furthermore, a pulley 19a fixed on the body 10 is disposed to one end of the lower arm 11a, and a timing belt 20a is suspended between the pulley 19a and a pulley 19b which is disposed to the other end of the lower arm 11a.

Further, a pulley 19c is disposed to the inside of one end of the upper arm 11b, and a timing belt 20b is suspended between the pulley 19c and a pulley 19d which is disposed to the other end of the upper arm 11b. The pulley 19c is fixed on a tip part of a cylindrical shaft which is raised at one end of the lower arm 11a. Furthermore, the pulley 19d disposed to the other end of the upper arm 11b is rotatably mounted to a cylindrical shaft raised at one end of the upper arm 11b through the bearing, and a supporting member 21a for fixing an upper finger 21 whose upper surface supports the semiconductor wafer W is fixed on an upper surface of the pulley 19d. Besides, the pulley 19a and the pulley 19b, or the pulley 19d and the pulley 19c are so constructed that the ratio of the diameter of respective combination is 2:1. Accordingly, when the rotations of the arm driving motor 15 are transmitted to the lower arm 11a through the reduction gear 16, the lower arm 11a is rotated around the central axis C2 extending in the vertical direction. Then, in an interlocking manner with the rotations of the lower arm 11a, the upper arm 11b rotates in an opposite direction to the rotation direction of the lower arm 11a by an angle twice the rotation angle of the lower arm 11a around the central axis C3.

According to the above-mentioned construction, the upper and lower arms 11a, 11b are respectively rotated in opposite directions around the respective central axes C2, C3 by the arm driving motor 15, so that the arm body 11 can extend and contract in a state in which the upper finger 21 is faced in a predetermined direction, and can transfer the semiconductor wafer W supported on the upper finger 21 to a predetermined position. Besides, structures of the other arm body 12 provided to the transfer robot 1 are similar to ones of the arm body 11 except for the upper and the lower fingers 21, 22. The upper and lower arms 11a, 11b composing the arm body 11 are symmetrical with the upper and the lower arms 12a, 12b composing the arm body 12, and these are operated on the same operation principles as the arm body 11. Therefore, an explanation of the arm body 12 is omitted.

The upper and the lower fingers 21, 22 are independently reciprocated from a front side to a rear side of the paper in FIG. 2 by the expanding/contracting operation of the arm bodies 11, 12, respectively. Here, the upper finger 21 and the lower finger 22 are disposed at a predetermined interval in an up-and-down direction to avoid collisions with each other. Further, the supporting member 21a of the upper finger 21 and the supporting member 22a of the lower finger 22 are members for supporting the semiconductor wafer W due to a vacuum sucking force, and the upper and the lower fingers 21, 22 are so constructed that the supporting members 21a, 22a are respectively disposed at the same position in a top surface view. Furthermore, an upper list portion 21b composing the upper finger 21 is in a nearly U-shaped form to avoid collisions with the semiconductor wafer W supported by the supporting member 22a of the lower finger 22 when reciprocating. Further, a lower list portion 22b composing the lower finger 22 is disposed below the supporting member 22a so as not to interfere with the upper finger 21.

As mentioned above, the pulleys 19a, 19b, 19c, 19d are constituted rotatably with respect to the upper and the lower arms 11a, 11b or each shaft, respectively. Here, to allow rotation of the pulleys 19a, 19b, 19c, 19d, bearings are located between each pulley and the upper and the lower arms 11a, 11b or each shaft. Further, as each bearing to be disposed to the transfer robot 1, a cross roller bearing or a radial bearing, which has strength for supporting radial load or thrust load caused by the upper and the lower arms 11a, 11b, or moment load of the shaft, is used. Since these bearings are degraded or damaged due to long use, they are needed to be exchanged. Furthermore, the bearings are also used inside the motors 8, 13, 15, 15' and the reduction gears 14, 16, 16', and they are also needed to be exchanged because of their deterioration or damage. For the deterioration of such a bearing, an indication such as vibrations or abnormal noises frequently appear before the bearing is damaged. Further, in case of long-term use, the vibrations or the abnormal noises are sometimes caused by looseness of screws for fixing the components or deterioration of the components. A waveform analysis unit 30 of the present invention can prevent troubles due to a failure of the transfer robot 1 by analyzing the physical phenomenon such the vibrations or the abnormal noises and then by repairing the degraded places.

Figure 4:
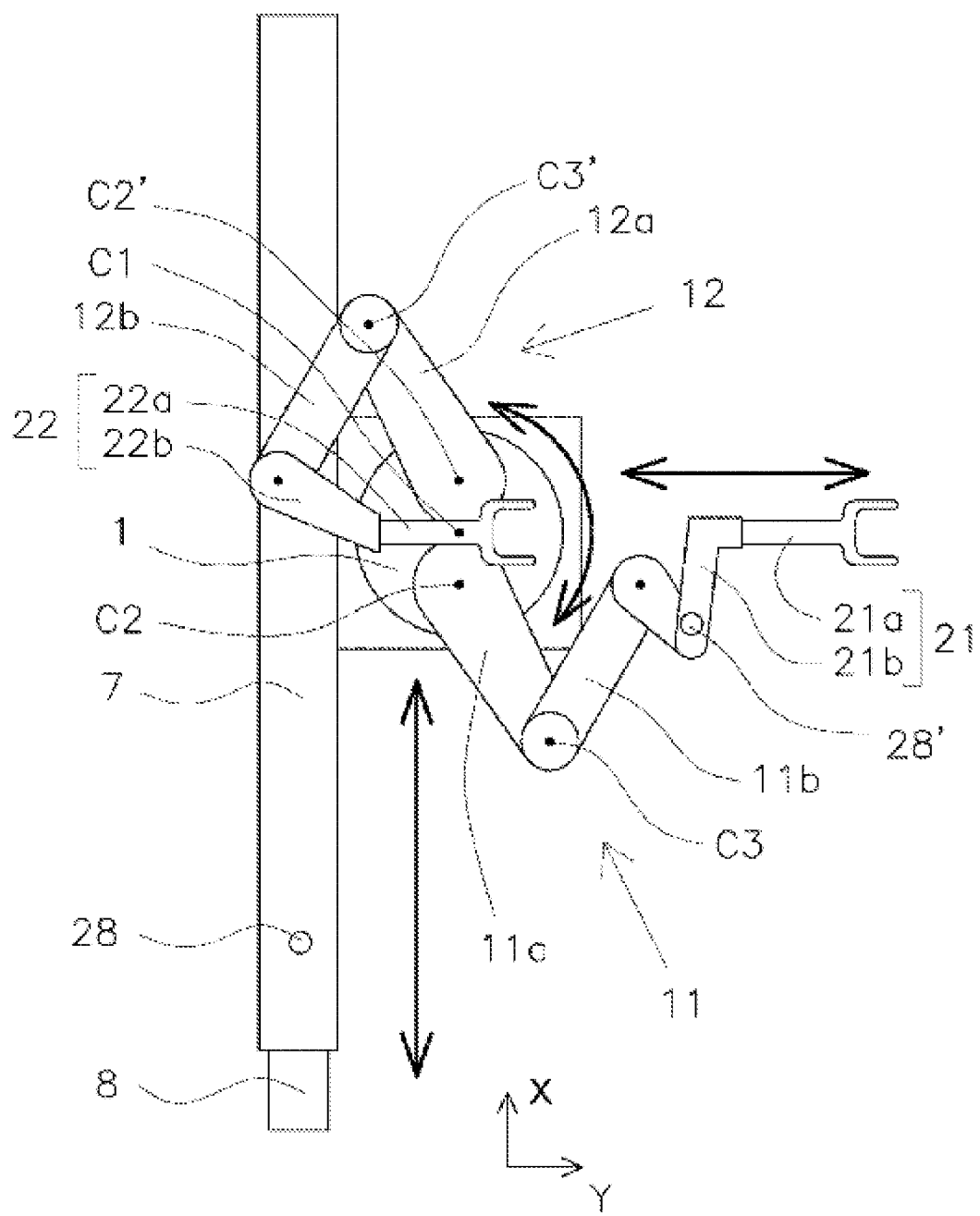
FIG. 4 is a plane view showing outline of the transfer robot 1.
Figure 5:
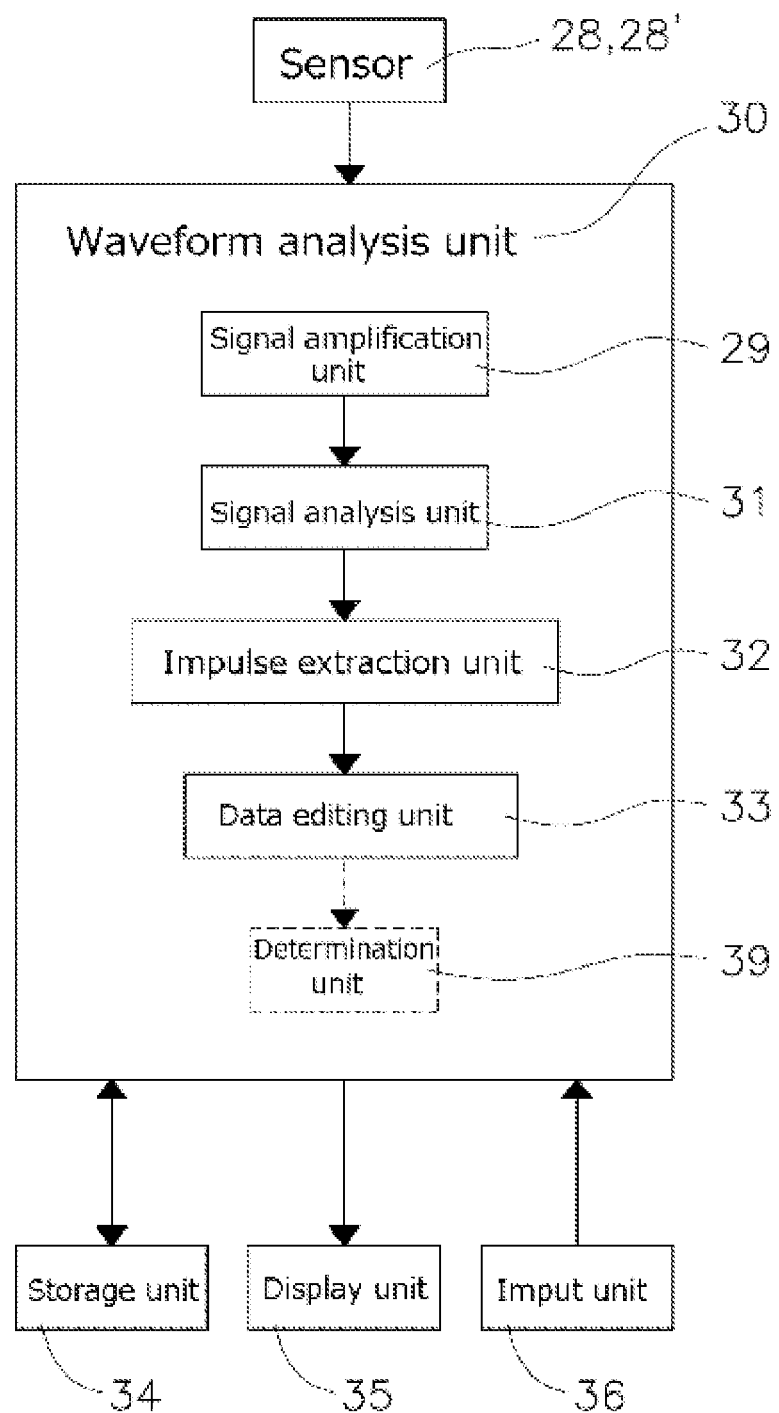
FIG. 5 is a block view showing a configuration of a waveform analysis device 30 of one embodiment of the present invention.

Next, the waveform analysis unit 30 and a waveform analysis method of the present invention will be explained below. FIG. 5 is a block view showing a configuration of the waveform analysis unit 30 of one embodiment of the present invention. The waveform analysis unit 30 is composed of a not-illustrated power supply unit, a signal amplification unit 29 for amplifying a signal transmitted from a sensor 28, a signal analysis unit 31 for analyzing the amplified signal, an impulse extraction unit 32, and a data editing unit 33, and besides, is constituted so as to be connectable to a storage unit 34, a display unit 35, and an input unit 36. The sensor 28 is efficient when the physical phenomenon generated by operation of an inspection target such as vibrations, sounds or electromagnetic waves can be detected and transmitted as an electrical signal. Besides, vibration sensors 28, 28' connected to the waveform analysis unit 30 of the present embodiment are fixed to an object to be detected, and have an accelerometer for detecting acceleration generated by operation of the object to be detected. Further, the vibration sensor 28 is fixed on the horizontal travel mechanism 7, and the vibration sensor 28' is fixed on the upper list portion 21b of the transfer robot 1. See FIG. 4. The vibration sensors 28, 28' detect the acceleration generated accompanied by the operations of the transfer robot 1 and the horizontal travel mechanism 7, and namely, detect the acceleration regarding predetermined two axes perpendicular to each other among X-axis, Y-axis and Z-axis. Besides, the vibration sensors 28, 28' are mounted so as to detect accelerations in an X-axis direction and in a Z-axis direction, respectively.

The signal amplification unit 29 amplifies the signal transmitted from the vibration sensors 28, 28' and transmits the amplified signal to the signal analysis unit 31. The signal analysis unit 31 receives the signal transmitted from the signal amplification unit 29, and exchanges the received signal to a digital signal, and then, transmits to the display unit 35 by making into a graph in which the horizontal axis is a time scale and the vertical axis is acceleration after eliminating noise components of the signal through a filter circuit. See FIG. 7 and FIG. 8. Further, a fast Fourier transformation is successively performed on the signal eliminated the noise components to generate frequency spectral data, and the generated frequency spectral data are transmitted to the display unit 35 and the impulse extraction unit 32. See FIG. 9 and FIG. 10. Furthermore, these data are transmitted to and stored in the storage unit 34 at predetermined times. Besides, in the present embodiment, the signal amplification unit 29 and an A/D converter is constructed so as to be provided inside the waveform analysis unit 30, but without being limited to this, the signal amplification unit 29 and the A/D converter may be constructed so as to be provided inside the vibration sensors 28, 28'. The construction of the waveform analysis unit 30 can be simplified by providing the signal amplification unit 29 and the A/D converter in the vibration sensors 28, 28'. Further, the signal transmitted from the vibration sensor 28 is processed for amplification, thereby reducing a bad influence by noises entering a cable for transmitting the signal from the vibration sensor 28 to the waveform analysis unit 30.

The impulse extraction unit 32 converts the frequency data of the impulse components caused by trouble or collision from spectrum data generated by the signal analysis unit 31 to an absolute value, and thereafter, calculates the total amount of the impulse components in the frequency band. The data editing unit 33 edits the total sum of the impulse components calculated by the impulse extraction unit 32 into a spectrogram showing a frequency in the horizontal axis and a generation time in the vertical axis, and displays the spectrogram on the display unit 35. See FIG. 9 and FIG. 10. In the spectrogram edited by the data editing unit 33 of the present embodiment, the intensity of each impulse component is expressed in the brightness of the screen, namely, the portion in which the brightness is high has a high impulse component intensity and the portion in which that the brightness is low has a low impulse component intensity. Besides, the impulse component intensity can be constructed so as to be expressed by changing the saturation of the color correspondent to the growing density except for being expressed by the brightness of the screen.

The storage unit 34 stores the data transmitted from the sensor, the data calculated by the signal analysis unit 30 and the impulse extraction unit 32, and the spectrogram generated by the data analysis unit 33. The display unit 35 is a monitor for displaying the spectrum data generated by the signal analysis unit 31 and the spectrogram generated by the data editing unit 33. The worker specifies a range for generating the spectrogram by watching the waveform displayed on the display unit 35, and also confirms the generated spectrogram. Besides, the display unit 35 of the present embodiment is constructed so that the impulse component intensity in the spectrogram is expressed with the brightness of the screen, and namely, the impulse component intensity is displayed with the brightness of dots of the screen.

The input unit 36 is an input means such as a keyboard, a mouse or a trackball, and the worker uses it to transmit instruction information to the waveform analysis unit 30. Besides, the storage unit 34, the display unit 35 and the input 36 can be provided to the body of the waveform analysis unit 30 or can be separately provided to the body. Further, a determination unit 39 for determining whether or not abnormality occurs from the impulse data calculated by the impulse extraction unit 32 can be provided. On the basis of a threshold stored in the storage unit 34, the determination unit 39 promotes a repair operation to by displaying a warning on the display unit 35 in case that the impulse component occurs exceeding the threshold in the edited data. Besides, it is desirable that the threshold is determined by comparing the intensity of the impulse component included in the physical phenomenon generated by the machinery in the normal state and the intensity of the impulse component generated by the machinery in which abnormality occurs.

Figure 6:
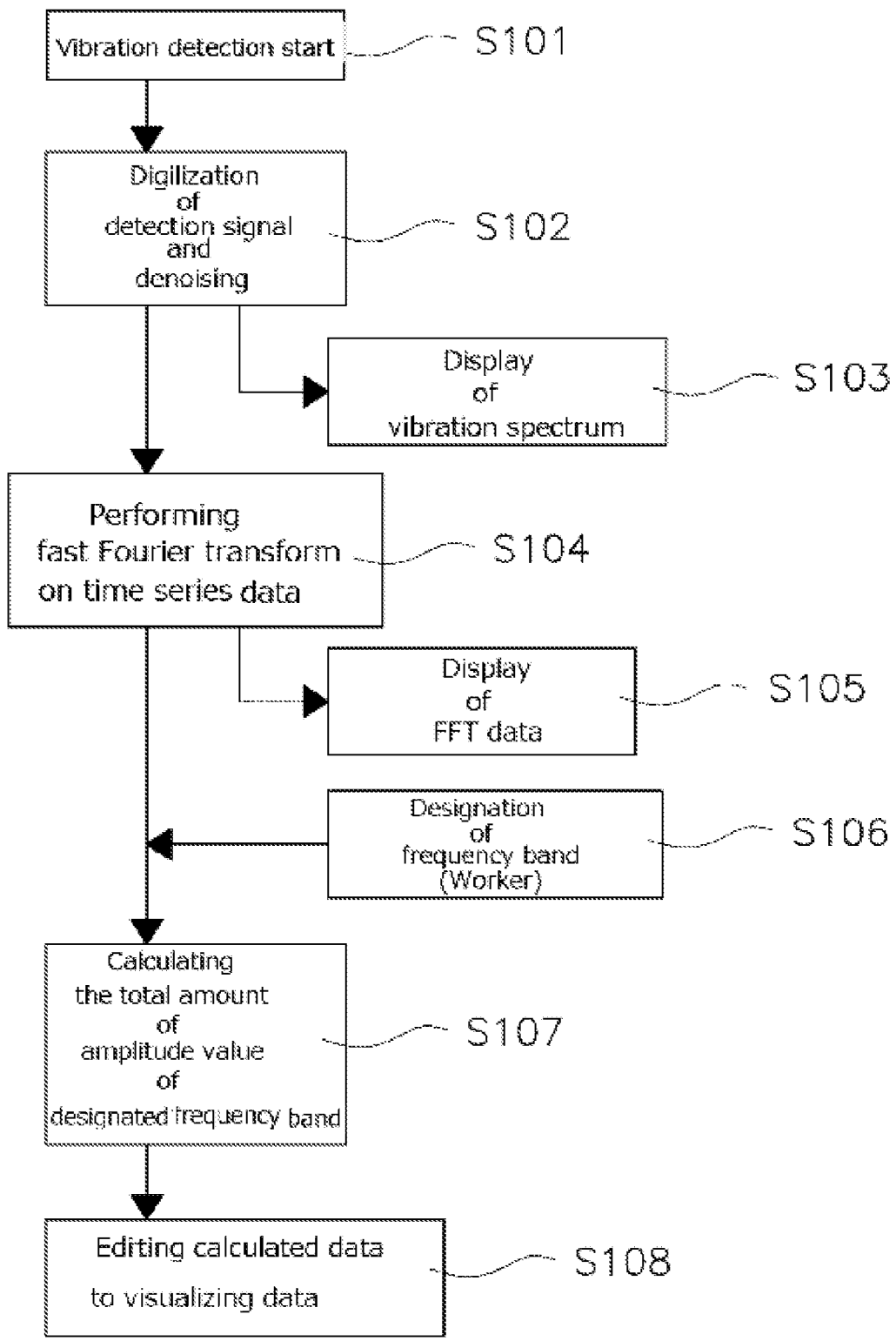
FIG. 6 is a view showing a processing flow of waveform analysis due to the waveform analysis unit 30 of the present invention.

Next, a signal processing procedure performed by the waveform analysis unit 30 of the present invention will be explained. FIG. 6 is a view showing a processing flow of waveform analysis due to the waveform analysis unit 30 of the present invention. Here, the waveform analysis unit 30 analyzes the vibrations generated by operation of the transfer robot 1 when the transfer robot 1 transfers the semiconductor wafer W from the FOUP 3 to the load lock chamber of a relay chamber. Besides, an operating speed of each driving unit of the transfer robot 1 is a normal conveyance speed of the transfer robot 1, and no special speed setting is needed for detecting the vibrations.

First of all, the worker mounts the vibration sensors 28, 28' at the predetermined places. An instruction for performing a predetermined transfer operation is transmitted to the transfer robot 1 by operating the semiconductor manufacturing system 2. The vibration sensors 28, 28' start detecting vibrations generated from each driving mechanism when the transfer robot 1 conducts the transfer operation (Step S101). As mentioned previously, the vibration sensors 28, 28' to be connected to the waveform analysis unit 30 of this embodiment are fixed on the horizontal travel mechanism 7 and on the upper list portion 21b, respectively. See FIG. 4.

The vibrations detected by the vibration sensors 28, 28' are converted to electrical signals, and the converted electrical signals are amplified by the signal amplification unit 29, and thereafter transmitted to the signal analysis unit 31. Then, the electrical signals are converted to digital signals by an A/D convertor through the signal analysis unit 31, and noise components of the signals are eliminated (Step S102). In addition, the signals, from which the noise components are eliminated, are displayed on the display unit 35 as a vibration frequency with a horizontal axis as a time scale and a vertical axis as an acceleration (Step S103). Further, the calculated data are transmitted and recorded in the storage unit 34.

Next, the signal analysis unit 31 generates frequency spectral data by successively performing a fast Fourier transformation (FFT) to the vibration data after ones exceeding the upper limit of the predetermined amplitude among time-series amplitude data from which the noise components are eliminated are rounded to the upper limit value and then the lower limit value is subtracted from the amplitude value (Step S104). Besides, background vibrations caused by operation of a device other than the transfer robot 1 like FFU provided to the EFFM4 in which the transfer robot 1 is disposed are eliminated from the vibration data by subtracting the lower limit value from this amplitude value. In addition, the signal analysis unit 31 displays the vibration data subjected to the fast Fourier transform on the display unit 35 and stores them in the storage unit 34 (Step S105).

Then, the worker designates a range of any frequency band from the frequency spectral data after the fast Fourier transform displayed on the display unit 35 (Step S106). When the range is designated, the impulse extraction unit 32 calculates the total amount of the impulse components in the frequency band after converting each frequency data from the frequency spectral data of the designated range to an absolute value (Step S107). The impulse components can be extracted by calculating the total amount of the amplitude value of each frequency data in the predetermined frequency band for the data by fast Fourier transforming. Here, a protruded portion of the displayed waveform represents the intensity of the impulse component, and working vibration by the malfunction is big so that the protruded portion is big. See FIG. 7(b) and FIG. 8(b).

The impulse data calculated by the impulse extraction unit 32 are transmitted to the data editing unit 33. The data editing unit 33 edits the received data to visualizing data which are expressed by three elements such as the frequency, the time and the impulse intensity, and displays them on the display unit 35 (Step S108). In addition, the edited visualizing data are stored in the storage unit 34. Besides, the data editing unit 33 of the present embodiment edits the impulse data transmitted from the impulse extraction unit 32 to spectrogram data, and displays the spectrogram data. The impulse waveforms are present dispersed in the wide frequency band. Then, since the components dispersed in the wide frequency band are displayed as the spectrogram data with a horizontal axis as a frequency, a vertical axis as a time scale, and brightness as the impulse intensity, the worker can recognize the presence of the malfunction only by viewing the display unit 35. See FIG. 9 and FIG. 10. Besides, although the data editing unit 33 of the present embodiment edits impulse data to spectrogram data, it is not limited to the spectrogram data. For example, as a bubble chart, a contour line graph, or a waterfall graph, any means is available if it is capable of displaying three elements of a frequency, a time scale and a spectrum intensity.

Figure 7A:
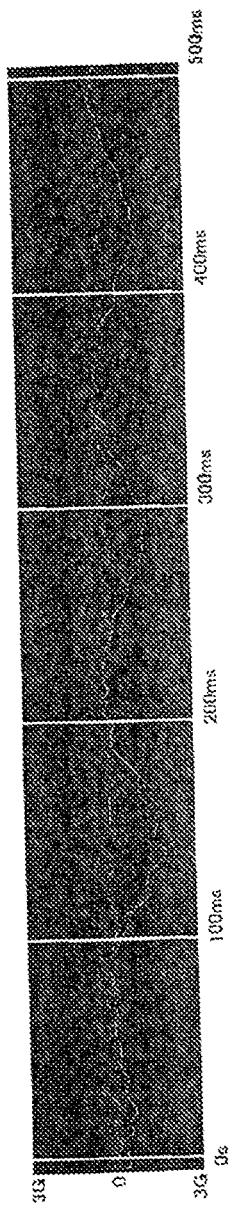
FIGS. 7a and 7b are waveforms representing vibration data detected by a vibration sensor mounted on an upper list portion of the transfer robot 1.
Figure 7B:
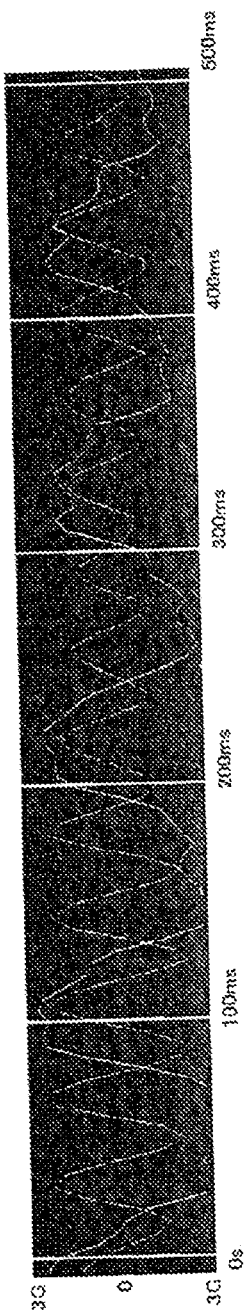
Figure 8A:
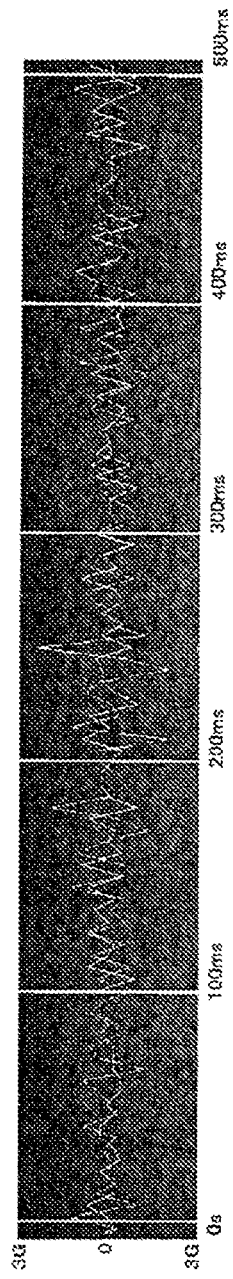
FIGS. 8a and 8b are waveforms representing vibration data detected by a vibration sensor mounted on a horizontal travel mechanism.

Next, spectral data of the vibrations detected by the vibration sensors 28, 28' and spectrogram generated by the data editing unit 33 will be explained. FIGS. 7a and 7b each show a vibration waveform detected by the vibration sensor 28' which is installed on the upper list portion 21b, and FIGS. 8a and 8b each show a vibration waveform detected by the vibration sensor 28 which is installed on the horizontal travel mechanism 7. In both vibration waveforms, an acceleration (G) is a vertical axis and a time scale (ms) is a horizontal axis. In both figures, (a) indicates a waveform during the normal operation, and (b) indicates a graph during operation in a state when a defect occurs on the bearing of the horizontal travel mechanism 7. These spectral data display a waveform for about 0.5 seconds among the whole data during operation of the transfer robot 1. In each graph, two line graphs represent vibrations in an X-axis direction and vibrations in a Z-axis direction which are detected by the vibration sensor 28, 28', respectively.

Figure 8B:
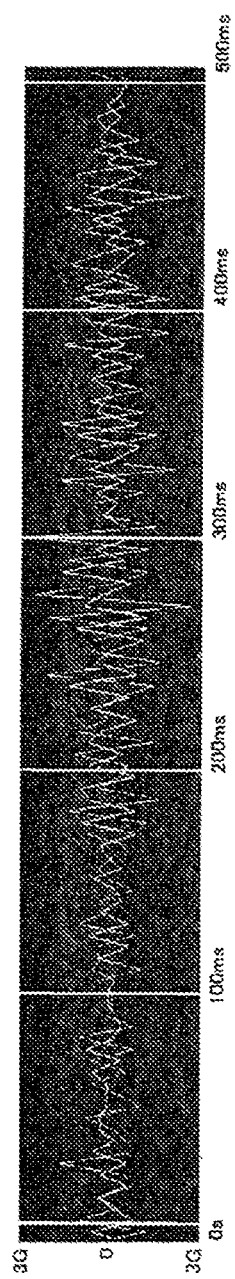

In both of FIG. 7 and FIG. 8, a great number of protruded waveforms having the impulse component appear in the waveform (b) during the occurrence of abnormality in comparison with the waveform (a) in the normal condition. In addition, the graph of FIG. 8(b) includes a great number of sharp waveforms with short intervals in comparison with the graph of FIG. 7(b). These are caused by a difference in a separation distance from vibration generation sources of both vibration sensors 28, 28', and/or by a difference in a vibration transfer rate of structure between the vibration source and the detection point. Further, in both graphs, (b) detects vibrations with large amplitude in comparison with (a). However, there are cases where vibrations due to individual differences between the devices are transmitted, and cases where vibrations generated by driving mechanisms of the FFU23 and the processing device 5 are transmitted, and therefore, it becomes more difficult to detect the abnormality with accuracy in a manner comparing the vibration waveforms simply. However, as discussed below, the worker can easily recognize an occurrence of abnormality by extracting and displaying the impulse components included in the vibration waveform by using an algorithm of the present invention.

Figure 9A:
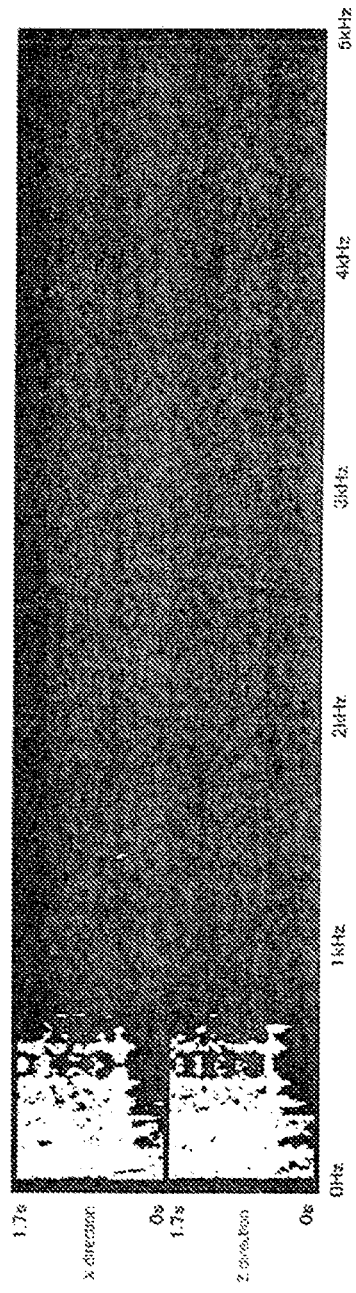
FIG. 9a shows a spectrogram after the vibration data illustrated in FIG. 7a is performed at a fast Fourier transform.
Figure 9B:
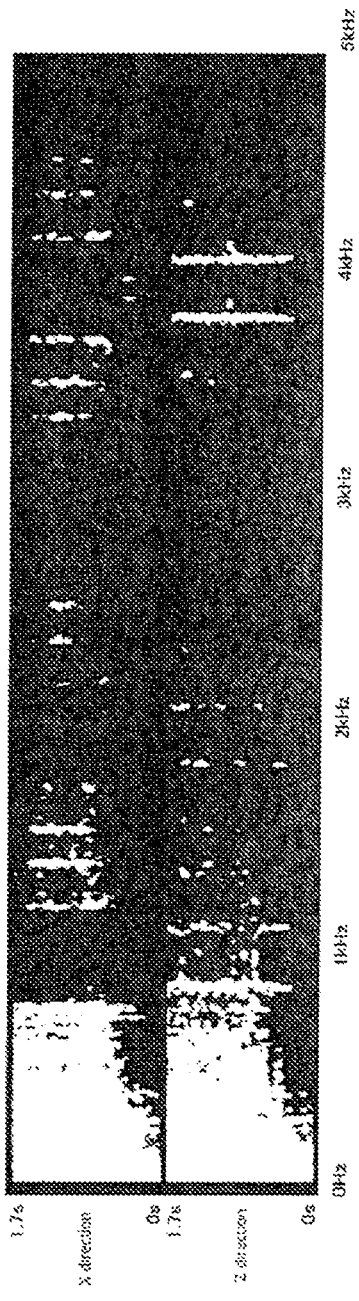
FIG. 9b shows a spectrogram after the vibration data illustrated in FIG. 7b is performed at a fast Fourier transform.

Next, an editing method for visualizing the impulse data in the algorithm of the present invention will be explained. FIGS. 9a and 9b and FIGS. 10a and 10b are spectrograms made by calculating the sum total of an amplitude value of each frequency after performing the fast Fourier transformation on the vibration data during operation of the transfer robot 1. FIGS. 9a and 9b are generated by spectrograming after fast Fourier-transforming, respectively the vibration data shown in FIGS. 7a and 7b, and FIGS. 10a and 10b are is generated by spectrograming after fast Fourier-transforming, respectively the vibration data shown in FIGS. 8a and 8b. In both figures, (a) indicates data during the normal operation, and (b) indicates data during operation in a state when a defect occurs on the bearing. Each figure indicates that a generation frequency of vibrations is high so that the brightness on the screen increases, wherein the total of the time when the vibrations of the frequency band are generated is expressed with a horizontal axis as a frequency of vibration data and with a vertical axis as time scale. Further, (a) and (b) are made in a view of a two-stage constitution in which values relating to each detection direction of the vibration sensors 28, 28' are displayed individually.

Figures 10A, 10B:
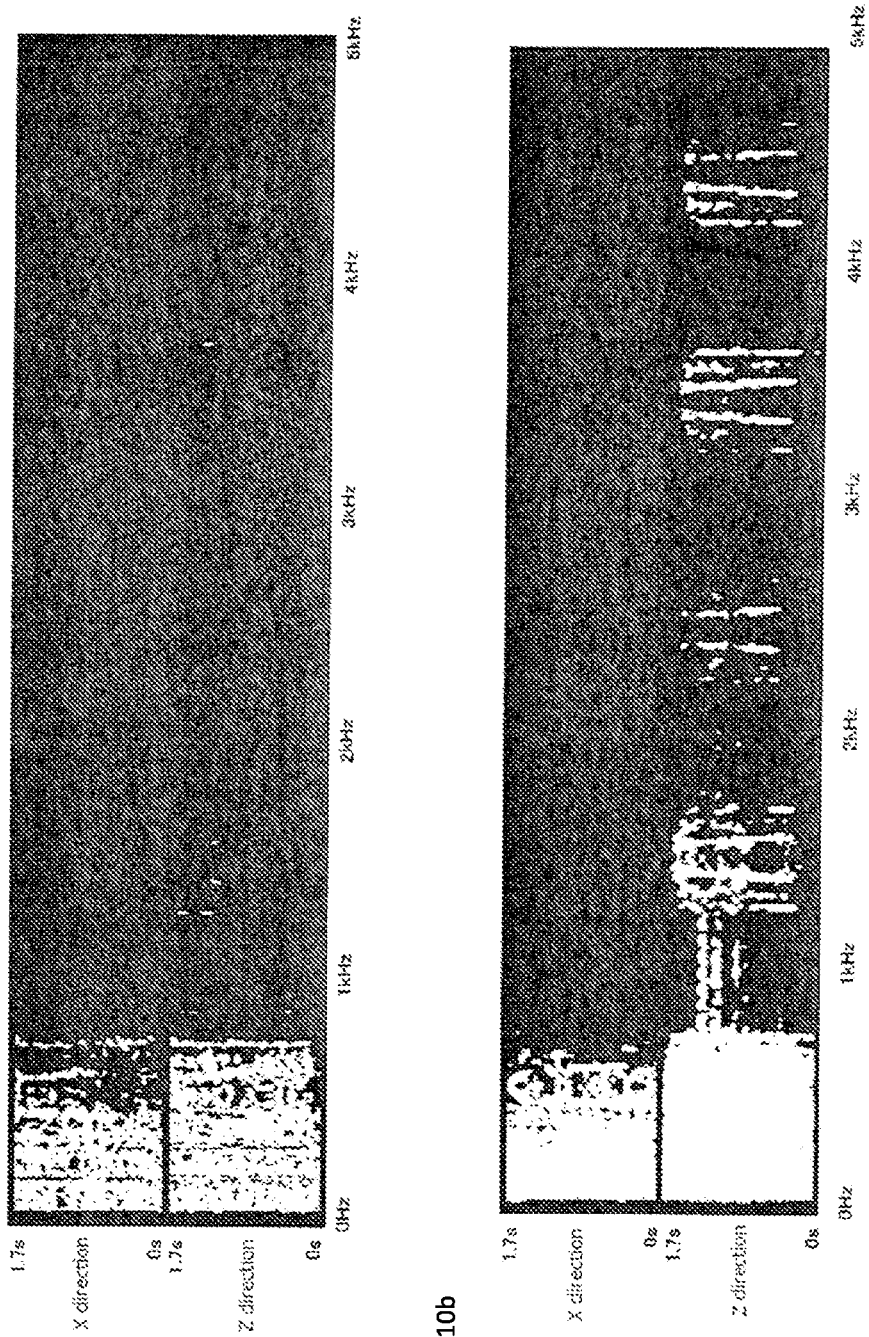
FIG. 10a shows a spectrogram after the vibration data illustrated in FIG. 8a is performed at the fast Fourier transform.
FIG. 10b shows a spectrogram after the vibration data illustrated in FIG. 8b is performed at a fast Fourier transform.

In both FIG. 9 and FIG. 10, it can be confirmed in the normal data (a) that the vibrations with comparative low frequency up to 1 kHz occur, and that the impulse components with a frequency exceeding 1 kHz scarcely occur. In contrast, it can be confirmed in the data during the occurrence of defect that the impulse components with the comparative low frequency up to 1 kHz occur, but that the vibrations occur over the whole range of the frequency exceeding 1 kHz. As mentioned previously, because the impulse components have the feature occurred over the whole range of the frequency band, it is possible to grasp that the defect occurs on the driving mechanism in view of the spectrogram of FIG. 9(b) and FIG. 10(b). In this way, it can be predicted, the higher the frequencies of occurrence of vibrations on the whole range of the analyzed frequency band are, there is a high possibility that a fault occurs on the component of each driving mechanism.

Although it is explained about a method in which the occurrence of abnormality is predicted by detecting vibrations that the transfer robot 1 generates during operation and by analyzing the detected data in accordance with the above-described algorithm in the above-mentioned embodiment, the present invention is not limited to this. The occurrence of abnormality can be predicted by detecting sounds which the transfer robot 1 emits during operation and by analyzing the detected data in accordance with the above-described procedure, other than the vibrations. On the whole, it is possible to analyze a physical phenomenon generated during operation even if it is any physical phenomenon. Further, if it can be detected as a waveform. Further, the signal waveform analysis device of the present invention can be applied other than the purpose to predict the occurrence of abnormality of the machinery.

Next, the second embodiment related to the waveform analysis device of the present invention will be explained. Recently, a semiconductor manufacturing system 2 with a video camera 37 will increase. The video camera 37 used in the present invention is disposed in an internal clean space of the EFEM 4 to make a film of the operations of the transfer robot 1 and other machineries all the time, and to record the image into a not-illustrated recorder such as a hard disk or a memory as recorded data. In addition, motors 8, 13, 15 of a driving source of the transfer robot 1 respectively have a not-illustrated driver for controlling each motor, and the driver detects collisions of the machinery with other structures or the received excessive load as an abnormality and suddenly stops the transfer robot 1, thereby preventing the escalation of trouble. Then, when the transfer robot 1 is stopped in emergency due to the trouble, the worker can efficiently proceed repair work by reproducing the recorded image and by specifying an abnormality occurrence place.

However, a data amount of this moving data is large and a capacity of the recording device is also restricted, and therefore, old moving data are erased by overwriting on newly filmed moving data in order. In addition, when a comparative large impact occurs, the driver detects it as abnormality. For example, in case of such a comparative small impact which the wafer W of a transfer object is rubbed against a wall of the FOUP 3 being a transferring destination, sometimes, the driver does not detect it as abnormality. Therefore, the wafer W contacting the FOUP 3 has dust generated by the contact adhered on the surface, and a circuit pattern is not formed on the portion where the dust adhered, and therefore, the wafer W becomes a defective article.

Further, image data photographed by the video camera 37 provided to the machinery are overwriting on new image data in order, and therefore, the image data at occurrence of abnormality are often overwriting on new image data already when the defective article is found. Therefore, even if the abnormality of the defective-article occurrence is found in an inspection stage, it is extremely difficult to trace the cause of the defective article. Then, detecting the abnormality such as the fine collisions immediately by using the signal waveform analysis device of the present invention can show large effect upon managing quality of a product and improving the yield.

In the present embodiment, a microphone 38 for detecting sound which the transfer robot 1 generates during operation is fixed inside the EFEM 4, and detects the sound generated by the operation of the transfer robot 1 all the times while the transfer robot 1 operates. A control program of the waveform analysis unit 30 is constructed so as to report the occurrence of abnormality to the display unit 35 by transmitting the abnormality occurrence signal to the control program of the video camera 37 when the waveform analysis unit 30 detects the impulse component from the sound signals. In addition, the control program of the video camera 37 is constructed so as to store the image data recorded for several minutes before and after it without overwriting in receiving the abnormal occurrence signals from the waveform analysis unit 30. According to this, the worker can immediately grasp the occurrence of abnormality when an abnormality which may reduce the quality like contact or collision of the wafer W occurs. Further, by confirming the stored image data, it is possible to grasp what kind of abnormality occurred and to settle troubles for a short time.

Figure 11A:
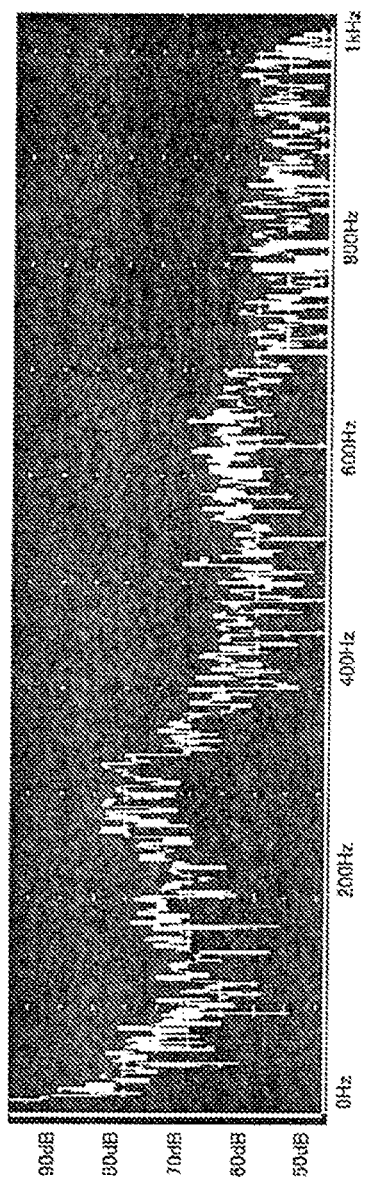
FIGS. 11a and 11b are a sound spectrum that the transfer robot 1 performed sound generated during operation at the fast Fourier transform.
Figure 11B:
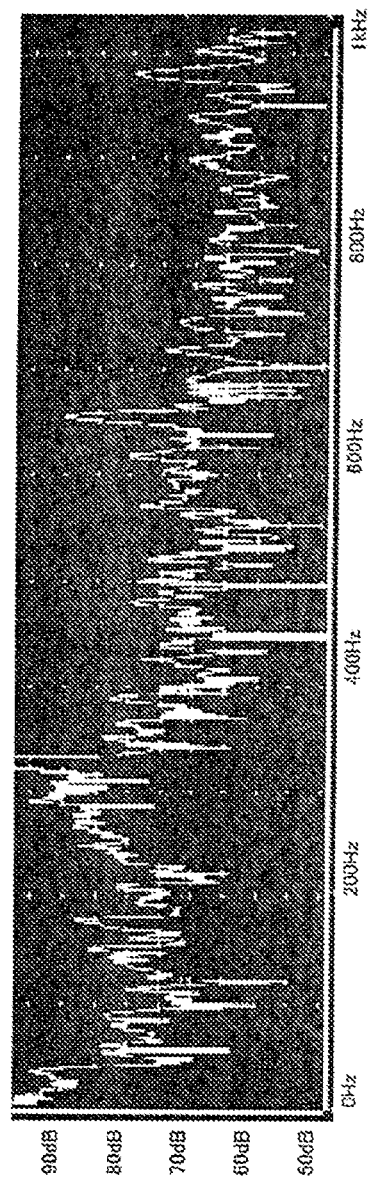
Figure 12:
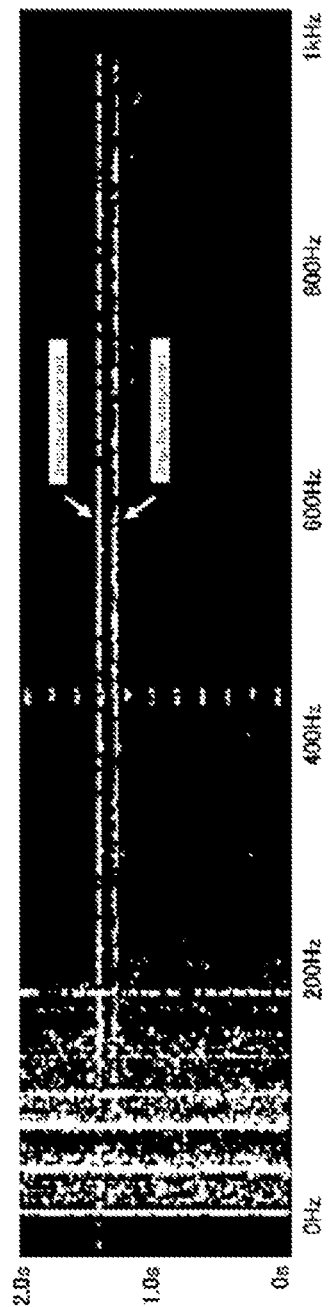
FIG. 12 shows a spectrogram based on a sound spectrum when a collision occurs.

FIGS. 11a and 11b each show a sound spectrum in which the fast Fourier transform is performed with respect to sound of a physical phenomenon that the transfer robot 1 generates during operation and that is detected by fixing the microphone 38 for detecting the sound generated by the transfer robot 1 during operation inside the EFEM 4. More particularly, FIG. 11(a) indicates that the sound inside the EFEM 4 wherein the wafer W is normally transferred is analyzed, and FIG. 11(b) indicates that the sound inside the EFEM 4 wherein the side wall of the FOUP 3 contacts the wafer W when the transfer robot 1 transfers the wafer W inside the FOUP 3 is analyzed. In addition, FIG. 12 indicates that the sound spectrum wherein the collision represented in FIG. 11(b) occurs is made in a spectrogram by the signal waveform analysis method of the present invention.

Comparing FIG. 11(a) with FIG. 11(b), although the waveforms are viewed similarly, the waveform of FIG. 11(b) transitions with an approximately 10 dB higher value in comparison with FIG. 11(a). This is caused in including the same amount as the whole frequency components, which is characteristic of an impulse waveform, and able to be found because the microphone 38 detects ones generated when the wafer W contacts FOUP 3. In addition, FIG. 12 clearly displays the impulse components existing in frequency bands. According to this, by detecting and analyzing the very fine sound of the contact of the wafer W and the FOUP 3, it is possible to recognize an existence of the impulse waveform caused on the contact. Therefore, it is possible to perform the transmittance of the abnormality occurrence alarm and the save of the image data of the transfer robot 1 by considering the existence of the impulse waveform as a trigger. Besides, in the present embodiment, although the microphone 38 is used to detect the operation noise of the transfer robot 1, the operation noise may be detected by the sound sensor except for this. Further, the vibrations may be detected instead of the operation noise by mounting the vibration sensors 28, 28' on the upper and the lower fingers 21, 22 of the transfer robot 1.

The invention claimed is:

1. A waveform analysis a device for analyzing waveform of a detection signal, said detection signal being gained by detecting a physical phenomenon generated during an operation of a machinery, and said waveform of the detection signal including an impulse waveform that generates only for an extremely short time and includes a fixed amplitude in a wide frequency band, comprising:
- a signal analysis unit for applying a fast Fourier transformation on the detection signal, said detection signal being transmitted from a sensor for detecting the physical phenomenon, so that impulse components of said impulse waveform are dispersed over frequency widely in a spectrogram data obtained from the fast Fourier transformation;
- an impulse extraction unit for calculating a total amount of the impulse components of said impulse waveform in frequency bands of which range are designated by a worker to obtain impulse intensities in the respective frequency bands; and,
- a display unit for displaying the impulse intensities in the frequency bands.

2. The waveform analysis device as claimed in claim 1, wherein the sensor is a vibration sensor for detecting vibrations generated when the machinery is operated.

3. The waveform analysis device as claimed in claim 1, wherein the sensor is a microphone for detecting operation sound generated when the machinery is operated.

4. The waveform analysis device as claimed in claim 1, wherein the machinery is a transfer robot for transferring and holding a semiconductor wafer.

5. The waveform analysis device as claimed in claim 1, wherein the waveform analysis device is connected to a semiconductor manufacturing system.

6. A waveform analysis method in a waveform analysis device for analyzing a waveform of a detection signal, said detection signal being gained by detecting a physical phenomenon generated during an operation of a machinery, and said waveform of the detection signal including an impulse waveform that generates only for an extremely short time and includes a fixed amplitude in a wide frequency band, comprising:
- a signal analysis step for applying a fast Fourier transformation on the detection signal, said detection signal being transmitted from a sensor for detecting the physical phenomenon, so that impulse components of said impulse waveform are dispersed over frequency widely in a spectrogram data obtained from the fast Fourier transformation;
- an impulse extraction step for calculating a total amount of the impulse components of said impulse waveform in frequency bands of which range are designated by a worker to obtain impulse intensities in the respective frequency bands; and,
- a display step for displaying the impulse intensities in the frequency bands.

7. The waveform analysis device as claimed in claim 2, wherein the machinery is a transfer robot for transferring and holding a semiconductor wafer.

8. The waveform analysis device as claimed in claim 3, wherein the machinery is a transfer robot for transferring and holding a semiconductor wafer.

9. The waveform analysis device as claimed in claim 2, wherein the waveform analysis device is connected to a semiconductor manufacturing system.

10. The waveform analysis device as claimed in claim 3, wherein the waveform analysis device is connected to a semiconductor manufacturing system.

11. The waveform analysis device as claimed in claim 4, wherein the waveform analysis device is connected to a semiconductor manufacturing system.

\* \* \* \* \*